United States Patent
Carr

(10) Patent No.: US 7,810,152 B2
(45) Date of Patent: *Oct. 5, 2010

(54) SYSTEM AND METHOD FOR SECURELY CONTROLLING ACCESS TO DEVICE FUNCTIONS

(75) Inventor: Jeffrey Douglas Carr, San Diego, CA (US)

(73) Assignee: Broadcom Corporation, Irvine, CA (US)

( * ) Notice: Subject to any disclaimer, the term of this patent is extended or adjusted under 35 U.S.C. 154(b) by 2366 days.

This patent is subject to a terminal disclaimer.

(21) Appl. No.: 10/141,549

(22) Filed: May 8, 2002

(65) Prior Publication Data

US 2003/0210786 A1 Nov. 13, 2003

(51) Int. Cl.
*G06F 7/04* (2006.01)
*G06F 12/00* (2006.01)
*G06F 12/14* (2006.01)

(52) U.S. Cl. .................. 726/17; 726/21; 713/166; 713/324

(58) Field of Classification Search .............. 726/17, 726/21; 713/166, 324; 709/208
See application file for complete search history.

(56) References Cited

U.S. PATENT DOCUMENTS

| | | | |
|---|---|---|---|
| 4,757,534 A * | 7/1988 | Matyas et al. ............... 705/56 |
| 4,864,615 A | 9/1989 | Bennett et al. | |
| 4,897,785 A | 1/1990 | Zuger | |
| 5,148,479 A * | 9/1992 | Bird et al. ................. 713/155 |
| 5,349,249 A | 9/1994 | Chiang et al. | |
| 5,371,499 A | 12/1994 | Graybill et al. | |
| 5,390,317 A | 2/1995 | Weiss et al. | |
| 5,398,285 A * | 3/1995 | Borgelt et al. ............... 380/30 |
| 5,412,730 A | 5/1995 | Jones | |
| 5,442,704 A | 8/1995 | Holtey | |
| 5,586,185 A | 12/1996 | Shibata et al. | |
| 5,710,816 A | 1/1998 | Stork et al. | |
| 5,715,431 A | 2/1998 | Everett et al. | |
| 5,737,760 A | 4/1998 | Grimmer, Jr. et al. | |
| 5,813,001 A * | 9/1998 | Bennett ....................... 707/3 |
| 5,883,680 A | 3/1999 | Nykerk | |

(Continued)

FOREIGN PATENT DOCUMENTS

EP 0806772 11/1997

(Continued)

OTHER PUBLICATIONS

Bruce Schneier, 1996, "Applied Cryptography", John Wiley and Sons, 2nd edition, pp. 294-295.*

(Continued)

*Primary Examiner*—Benjamin E Lanier
(74) *Attorney, Agent, or Firm*—McAndrews, Held & Malloy, Ltd.

(57) ABSTRACT

Systems and methods that may securely control access to device functions are disclosed. A request is received to enable a feature of the device. In one embodiment, the device may be a set top box, for example. The device determines whether the feature is disabled, whether the feature can be enabled with authorization and whether a requester is authorized to enable the feature of the device. If the feature is disabled, if the feature can be enabled with authorization and if the requester is authorized to enable the feature of the device, then the feature of the device is enabled.

21 Claims, 7 Drawing Sheets

U.S. PATENT DOCUMENTS

| | | | | |
|---|---|---|---|---|
| 5,903,653 | A | | 5/1999 | Ross et al. |
| 5,937,065 | A | * | 8/1999 | Simon et al. ............... 380/262 |
| 5,991,197 | A | | 11/1999 | Ogura et al. |
| 6,031,391 | A | | 2/2000 | Couts-Martin et al. |
| 6,039,247 | A | * | 3/2000 | Reccia et al. ............... 235/379 |
| 6,070,243 | A | * | 5/2000 | See et al. ........................ 726/2 |
| 6,076,149 | A | | 6/2000 | Usami et al. |
| 6,088,450 | A | * | 7/2000 | Davis et al. ................ 713/182 |
| 6,118,873 | A | | 9/2000 | Lotspiech et al. |
| 6,134,628 | A | | 10/2000 | Hamadani |
| 6,185,127 | B1 | | 2/2001 | Myers et al. |
| 6,219,790 | B1 | * | 4/2001 | Lloyd et al. ................... 726/14 |
| 6,240,516 | B1 | | 5/2001 | Vainsencher |
| 6,286,104 | B1 | * | 9/2001 | Buhle et al. .................... 726/4 |
| 6,351,814 | B1 | | 2/2002 | Batinic et al. |
| 6,360,260 | B1 | | 3/2002 | Compliment et al. |
| 6,378,072 | B1 | | 4/2002 | Collins et al. |
| 6,389,532 | B1 | | 5/2002 | Gupta et al. |
| 6,446,179 | B2 | | 9/2002 | Baltar |
| 6,567,011 | B1 | | 5/2003 | Young et al. |
| 6,629,047 | B1 | | 9/2003 | Guliani et al. |
| 6,643,781 | B1 | * | 11/2003 | Merriam ...................... 726/35 |
| 6,647,434 | B1 | | 11/2003 | Kamepalli |
| 6,732,179 | B1 | | 5/2004 | Brown et al. |
| 6,742,116 | B1 | | 5/2004 | Matsui et al. |
| 6,754,738 | B2 | | 6/2004 | Brice et al. |
| 6,775,281 | B1 | | 8/2004 | Brown |
| 6,789,159 | B1 | * | 9/2004 | Carr et al. ................... 711/103 |
| 7,058,177 | B1 | | 6/2006 | Trimberger et al. |
| 7,548,622 | B2 | | 6/2009 | Carr |
| 2003/0046189 | A1 | * | 3/2003 | Asayama ..................... 705/27 |
| 2004/0268024 | A1 | | 12/2004 | Carr et al. |
| 2009/0254744 | A1 | | 10/2009 | Carr |

FOREIGN PATENT DOCUMENTS

| | | |
|---|---|---|
| WO | WO 94/10687 | 5/1994 |
| WO | WO 00/24192 | 4/2000 |
| WO | WO 00/76117 | 12/2000 |
| WO | WO 02/11289 | 2/2002 |

OTHER PUBLICATIONS

Digital Systems Design II: Synchronous System and Register Transfer Level Design, pp. 189-226, University of Machester: school of Electronics and Electrical Engineering.*

"State Diagram": Wikipedia, 2006.*

P.J. Lenior, "Functional Model for the DVB CPCM Framework," Royal Philips Electronics Presentation, Feb. 2002.

Rowan Vevers, "DVB Sub-Group on Commercial Requirements for Copy Protection Systems Report to the Eighteenth Meeting of the DVB Commercial Module (DVB-CM)," DVB Report, DVB-CP8(00)7, Oct. 2000.

Jeff Carr, "Response to DVB Call for Information, Copy Protection and Digital Rights Management Technologies," Broadcom Corp., Oct. 2001.

"Call for Proposals for Content Protection & Copy Management Technologies," DVB, DVB Technical Module Sub-Group on Copy Protection Technologies, DVB CPT rev 1.2, Jul. 2001.

Ji et al., "Open Letter following Proposal DVB-CPY-719," Feb. 2002.

"SCTE Proposed Standard Head-end Implementation of OpenCAS™," Society of Cable Telecommunications Engineers, Inc., Engineering Committee, Digital Video Subcommittee, SCTE DVS 278r1, Jul. 2000.

"Data-Over-Cable Interface Specification," MCNS Holdings, L.P., Security Systems Specification, SP-SSI-I01-970506, 1997.

"DES CBC Packet Encryption," General Instrument Corp., SCTE DVS/042, Nov. 1996.

"CD-Rom Based Application Software Consumer and SOHO Copying Trends," Merrill Research Associates, Apr. 2000.

"White Paper—The Ins and Outs of Content Delivery Networks," Stardust.com inc., Dec. 2000.

"CD-Rom Unauthorized Copying Study Executive Summary," Merrill Research Associates, Apr. 1999.

"UDAC-M Host Link Specification, Part 1: Overview," Keitaide-Music Consortium, Ver. 0.9, Dec. 2000.

"Keitaide-Music Technical Specification Part I Overview," Keitaide-Music Consortium, Ver. 1.0, Dec. 2000.

"EPRS8 White Paper," SecureMedia, Inc., 2000.

William Raike "Detailed Supplemental Technical Description of the RPK Public-Key Cryptographic System," 1996.

Joseph M. Winograd, "Audio Watermarking Technologies for Protection of Digital Audio and Video—Presentation to DVD CPTWG," Verance Corporation, Sep. 2000.

John Paddleford, "Digital Rights Management—Protecting Your Content," Microsoft Corporation, undated.

"Common Interface Specification For Conditional Access and Other Digital Video Broadcasting Decoder Applications," DVB, DVB Document A017, May 1996.

"Call for Proposals for Content Protection & Copy Management Technologies," DVD, DVB Technical Module Sub-Group on Copy Protection Technologies, Rev. 1.2, Jul. 2001.

Bechtolsheim et al., "Responses to DVB-CP Requirements (DVB-CM283) for the OCCAM Open Conditional Content Access Management System," Cisco Systems, Inc. Oct. 2001.

"NetDRM Technology Response to DVD Call for Proposals for Content Protection & Copy Management Technologies," DVD, Matsushita Electric Industrial Co., Ltd., Oct. 2001.

"Proposal for Content Protection & Copy Management Technologies submitted to DVB (Digital Video Broadcasting," Veridian, Oct. 2001.

"Response to the DVB-CPT Call for Proposals for Content Protection & Copy Management Technologies," Royal Phillips Electronics N.V., Oct. 2001.

Kish et al., "An Information Paper in Response to the Call for Proposals Issued by the DVB Copy Protection Technologies Sub-Group of the DVB Technical Module," VWM Companies, Oct. 2001.

"Proposals for Content Protection and Copy Management Technologies," Sony International (Europe), Oct. 2001.

Olsthoorn et al., "Flexcop—A Flexible Copy Protection Framework," Flexcop, undated.

"Proposals for DVB Content Protection & Copy Management Technologies," Nokia, Version 1.0, Oct. 2001.

"4C Entity Response to DVB CPT Call for Proposals Regarding Content Protection & Copy Management Technologies—Content Protection System Architecture—A Comprehensive Framework for Content Protection, with CPPM and CPRM Technologies," 4C Entity, LLC, Oct. 2001.

"SmartRight Answer to the Call for Proposals for Content Protection & Copy Management Technologies," Thomson Multimedia et al., Oct. 2001.

"Answer to Call for Proposals for Content Protection & Copy Management Technologies," Thales Communication, Oct. 2001.

"IBM Response to DVB CPT Call for Proposals Regarding Content Protection & Copy Management: xCP Cluster Protocol," IBM, Oct. 2001.

"Digital Transmission Licensing Administrator's (DTLA) Response to DVB-CPT Call for Proposals Concerning Content Protection & Copy Management Technologies Protected Transport of Commercial Entertainment Content Using DTCP Technology," DTLA, 2001.

Winograd et al., "Audio Watermarking System for Content Protection within a DVB CPCM Environment," Verance Corporation, Oct. 2001.

"Proposed Baseline DVB-CPCM Response to DVB-CPT Call for Proposal Concerning Content Protection & Copy Technologies," Matsushita Electric Industrial Co., Ltd., Oct. 2001.

"Response to the Call for Proposals Content Protection and Copy Management Technologies by DVB Copy Protection Technologies Sub-Group of DVB Technical Module," Pioneer Corporation, Oct. 2001.

Kudumais, et al., "OPIMA/OCCAMM: A Solution to DVB Call for Proposals for Content Protection & Copy Management Technologies," OCCAMM, undated.

Capitant et al., "Digital Rights Management & Copy Protection an Information Paper in Response to the Call for Proposals Issued by the DVB Copy Technologies Sub-Group of the DVB Technical Module," Macrovision Corporation and Widevine Technologies Oct. 2001.
"Content Protection System Architecture A Comprehensive Framework for Content Protection, with High-Bandwith Digital Content Protection (HDCP) Technology," Digital Content Protection, LLC, Oct. 2001.
"Digimarc Response to DVB_CPCM CFP: Watermarking Applications Information Paper," Digimarc Corporation, Oct. 2001.
Agnelli et al., "LAN Interconnection Via ATM Satellite Links for CAD Applications: The UNOM Experiment," undated.
Löytänä et al., "Session Management Problems in Narrowband Interactive Services," Ad Hoc Group on Systems for Interactive Services, undated.
"Presentation to the TM," Simulcrypt Technical Group, undated.
"The DVB Project Promotion and Communication Module," DVB Project Office, Digital Video Broadcasting Presentation, undated.
"Digital Video Broadcasting (DVB); Support for Use of Scrambling and Digital Broadcasting Systems," European Telecommunications Standards Institute, ETSI Technical Report ETR 289, Oct. 1996.
"Digital Video Broadcasting (DVB); DVB SimulCrypt; Part 1: Head-end architecture and synchronization," European Telecommunications Standards Institute, ETSI Technical Report TS 101 197-1 v1.1.1 Jun. 1997.
"IPsec Processing," Microsoft Corporation et al, 1998.
"IPsec Databases," Microsoft Corp. Document, undated.
Menezes, Van Oorschot, Vanstone, "Handbook of Applied Cryptography" Handbood of Applied Cryptography, CRC press Series on Discrete Mathematices and Its Applications, boca Raton, FL, CRC Press, US, 1997, pp. 400,401,551-553 (p. 400, paragraph 10.3.2-p. 401; p. 551, paragraph 13.3.1-p. 552; p. 553, paragrap.
Kudumais, et al., "OPIMA/OCCAMM: A Solution to DVB Call for Proposals for Content Protection & Copy Management Technologies," OCCAMM, Nov. 2001.
Agnelli et al., "LAN Interconnection Via ATM Satellite Links for CAD Applications: The UNOM Experiment," Jun. 1996.
Löytänä et al., "Session Management Problems in Narrowband Interactive Services," Ad Hoc Group on Systems for Interactive Services, Apr. 1996.
R. Olsthoorn et al., "Flexcop—A Flexible Copy Protection Framework," Irdeto Access BV, DVB-CPT-709, Nov. 2001.
IPSEC Databases, MSRIPv6, Microsoft Corp., Oct. 1998.
"Digital Video Broadcasting (DVB); Framing Structure, channel coding and modulation for digital terrestrial television", European Telecommunications Standards Institute; ETSI TS 101 197 V1.2.1; Technical Specification; 40 pages; Feb. 2002.
"Digital Video Broadcasting (DVB); DVB SimulCrypt; Head-end architecture and synchronization", European Telecommunications Standards Institute, ETSI EN 300 744 V1.4.1, European Standard (Telecommunications series), 49 pages, Jan. 2001.

"Creating a Subscription Service with Windows Media Rights Manager 7", Windows Media DRM 7, Microsoft Corp., 7 pages, Nov. 2000.
"Getting Started with Windows Media Rights Manager SDK", Windows Media DRM 7, Microsoft Corp., 6 pages, Jun. 2002.
"Macintosh Client Support for the Windows Media License Service", Windows Media DRM 7, Microsoft Corp., 2 pages, 2008.
"Macintosh Update for Windows Media License Service", Windows Media DRM 7, Microsoft Corp., 3 pages, Aug. 2001.
"New Features for Microsoft Windows Media Rights manager SDK 7.1", Windows Media DRM 7, Microsoft Corp., 3 pages, Oct. 2001.
"Protecting Audio and Video Content with Digital Rights Management", Windows Media DRM 7, Microsoft Corp., 15 pages, Apr. 2004.
"Security Overview of Microsoft Windows Media Rights Manager", Windows Media DRM 7, Microsoft Corp., 9 pages, Oct. 2001.
"Streaming Secure Files with Windows Media Rights Manager 7", Windows Media DRM 7, Microsoft Corp., 4 pages, Oct. 2000.
"Supporting Both Version 1 and Version 7 of Windows Media Rights Manager", Windows Media DRM 7, Microsoft Corp., 5 pages, Jan. 2001.
"Taking Advantage of Super Distribution with Windows Media Rights Manager 7", Windows Media DRM 7, Microsoft Corp., 5 pages, Nov. 2000.
"Digital Rights Management for Microsoft Windows Media™ Technologies, The proven DRM platform for secure digital media e-commerce", Microsoft Corp., 4 pages, 2001.
Communication with European Search Report for EP Application No. 03010381.6, Jan. 8, 2004.
Communication with European Search Report for EP Application No. 03010380.8, Nov. 15, 2006.
Communication pursuant to Article 94(3) EPC corresponding to EP Application No. 03010380.8, Mar. 25, 2009.
Communication with European Search Report for Application No. EP 01250253.0, Jul. 10, 2003.
Menezes et al., XP002245801, Data Integrity and Message Authentication, Handbook of Applied Cryptography, 1997, pp. 359-361, 497-499, 552 and 568-569, CRC Press, USA.
Raman, Anand, The Katapayadi Formula and the Modern Hashing Technique, 1997, IEEE, pp. 49-53.
Ragab et al., An Efficient Message Digest Algorithm (MD) for Data Security, 2001, IEEE, pp. 191-197.
Xie et al., Enhanced Multiple Huffman Table (MHT) Encryption Scheme Using Key Hopping, 2004, IEEE, pp. 568-571.
Arnold et al., The IBM PCIXCC: A new cryptographic coprocessor for the IBM eServer, 2004, IBM Journal of Research and Development, pp. 475-487.

* cited by examiner

| Description | No. of Bits | Program Cycle Protection | CRC Protection | Visible | HW Dedicated |
|---|---|---|---|---|---|
| Device ID | 64 | YES | YES | YES | YES |
| Key 1 | 64 | YES | YES | NO | YES |
| Key 2 | 64 | YES | YES | NO | YES |
| Mode Control 0 | 16 | | | | |
| Encrypt_Engine | 1 | YES | YES | YES | YES |
| Data_Output | 1 | YES | YES | YES | YES |
| Test_Port_Diag | 1 | YES | YES | YES | YES |
| Reserved | 13 | YES | YES | YES | - |
| Mode Control 1 | 16 | | | | |
| Reserved | 7 | NO | NO | YES | - |
| Lock_A | 1 | NO | NO | YES | YES |
| Reserved | 7 | NO | NO | YES | - |
| Lock_B | 1 | NO | NO | YES | YES |
| CRC32 | 32 | YES | | NO | YES |
| | | | | | |
| Total Bit Count | 256 | | | | |

Fig. 2

SYSTEM AND METHOD FOR SECURELY CONTROLLING ACCESS TO DEVICE FUNCTIONS

CROSS-REFERENCE TO RELATED APPLICATION

This application is related to and makes reference to U.S. patent application Ser. No. 10/141,197, filed May 8, 2002, now issued U.S. Pat. No. 7,681,043, entitled "System and Method for Configuring Device Features via Programmable Memory". Ser. No 11/141,197. This application is also related to and makes reference to U.S. patent application Ser. No. 10/141,599, filed May 8, 2002, now issued U.S. Pat. No. 6,789,159, entitled "System and Method for Programming Non-Volatile Memory".

INCORPORATION BY REFERENCE

The above-referenced U.S. patent applications and are hereby incorporated herein by reference in their entirety.

FIELD OF THE INVENTION

The present invention relates generally to systems and methods that securely control access to device functions.

BACKGROUND OF THE INVENTION

Devices are generally manufactured with particular features and functions that meet the particular requirements of customers. However, this can be a costly undertaking especially where a wide variety of features and functions are available and customer preferences are equally diverse. To make a new line of devices that have the features or perform the functions according to each customer's specification would require a process involving additional design time and manufacture set up, and such a process would lack many of the efficiencies that result from economies of scale. Under these circumstances, such a customized solution may be impractical.

In addition, even if such a customized solution is implemented, it still lacks the flexibility to permit modification (e.g., enabling or disabling) of particular features or functions as customer needs change. Thus, a customer who would like to enable or to disable a particular feature or function would have to purchase another new line of devices that are designed and manufactured to incorporate the modifications.

On the other hand, a device with all of the available features and functions enabled might not necessarily meet the requirements of most customers. For example, some customers might not have the advanced systems capable of handling devices enabled with the highest levels of security or encryption. Accordingly, such a solution still would lack flexibility. Furthermore, a device with all of the available features and functions enabled may be more costly than most customers would be willing to pay.

Further limitations and disadvantages of conventional and traditional approaches will become apparent to one of skill in the art, through comparison of such systems with the present invention as set forth in the remainder of the present application with reference to the drawings.

What is needed, therefore, is a device that, for example, permits a customer to conveniently enable or disable allowed features and functions, but that also prohibits a customer from enabling non-allowed features and functions, in a cost efficient and secure manner.

SUMMARY OF THE INVENTION

Aspects of the present invention may be found in systems and methods that may securely control access to device functions. In one embodiment, the present invention may provide a method for securely controlling access to a feature of a device. The method may include the steps of receiving a request to enable the feature of the device; determining whether the feature is disabled; determining whether the feature can be enabled with authorization; determining whether a requestor is authorized to enable the feature of the device; and if the feature is disabled, if the feature can be enabled with authorization and if the requestor is authorized to enable the feature of the device, then enabling the feature of the device.

In another embodiment, the present invention may provide a system for securely controlling access to features of a device. The system may include a non-volatile memory coupled with a processor. The non-volatile memory may include mode control bits that correspond to the features of the device. The mode control bits are structured to indicate whether a particular feature of the device is one of disabled, enabled or capable of being enabled with user authorization. The processor may be structured to perform the steps of receiving a request to enable the particular feature of the device; determining whether the particular feature is disabled; determining whether the particular feature can be enabled with the user authorization; and determining whether a user is authorized to enable the particular feature of the device. If the particular feature is disabled, if the particular feature can be enabled with the user authorization and if the user is authorized to enable the particular feature of the device, then the processor performs the step of enabling the particular feature of the device.

These and other features and advantages of the present invention may be appreciated from a review of the following detailed description of the present invention, along with the accompanying figures in which like reference numerals refer to like parts throughout.

BRIEF DESCRIPTION OF THE DRAWINGS

FIG. 2 shows a table illustrating an example of a memory allocation within a non-volatile memory according to the present invention.

DETAILED DESCRIPTION OF THE INVENTION

Figure 1:
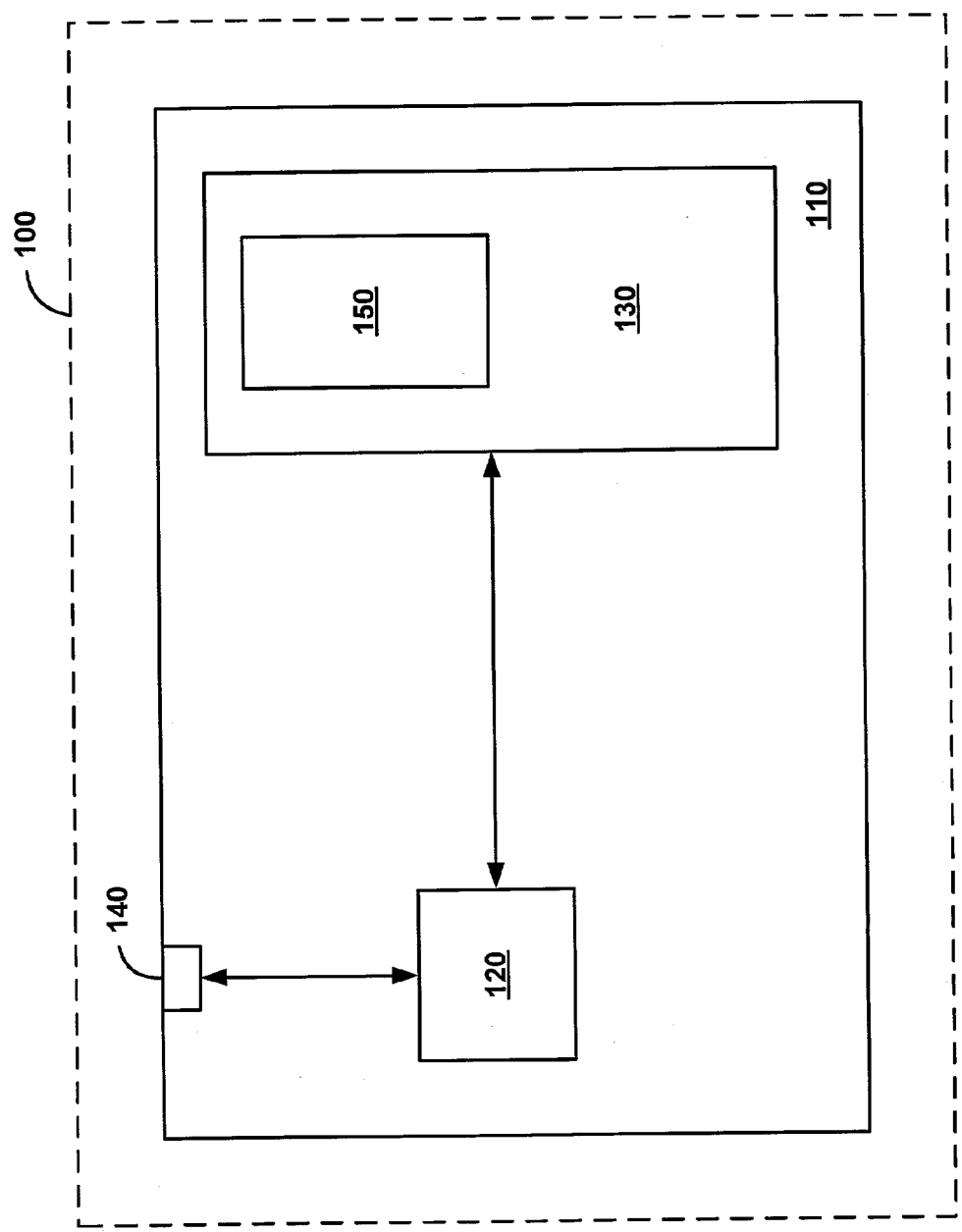
FIG. 1 shows an example of a device including a chip according to the present invention.

FIG. 1 shows an example of a device 100 including a chip 110 according to the present invention. Although the chip 110 is illustrated as part of the device 100, it may be external to the device 100 and merely coupled to the device 100. The chip 110 may include a processor 120, a memory array 130 and a chip interface 140. The memory array 130 may include a non-volatile memory 150 such as, for example, a one-time programmable non-volatile memory. The non-volatile memory 150 may include, for example, banks of mode control bits. The processor 120 is coupled to the memory array 130 and the chip interface 140 via buses or other conventional communication means known to one of ordinary skill in the art. The device 100 communicates with the chip 110 via, for example, the chip interface 140. In one embodiment, the device 100 is a set top box, for example. Of course, other types of devices are also contemplated by the present invention.

In operation, the non-volatile memory 150 of the memory array 130 can be programmed during a programming cycle or outside of the programming cycle by the processor 120 or by data received by the processor 120 via the chip interface 140. During the programming cycle, a first set of banks of the mode control bits are programmed which correspond to configurations of features or functions of the device 100 that are desired. The first set of banks can be locked out using protection built into the programming cycle. For example, when the programming cycle is complete, subsequent changing of bit values within the first set of banks of the mode control bits can be prohibited.

A second set of banks of the mode control bits can be programmed outside of the programming cycle (e.g., subsequent to the programming cycle completion). The second set of banks of the mode control bits can also be used to program the device 100. The second set of banks may correspond to the same or different features and functions as the first set of banks. Furthermore, the second set of banks may or may not override or cancel out similar features and functions set in the first set of banks during the programming cycle. Once a bank in the second set of banks of the mode control bits is programmed, the locking mechanism corresponding to the respective bank can be programmed to lock the programmed values in the respective bank. For example, one of the bits in the bank can be reserved (e.g., a locking bit) for the locking mechanism such that when the particular bit has been programmed (e.g., a one-time programming of the locking bit resulting in the change from a binary 0 to a binary 1), then the values stored in the respective bank are locked and cannot be modified in the future. Although illustrated as a single bit, one or more bits can be reserved for the locking mechanism of a particular bank. Furthermore, the locking bit or bits need not be part of the respective bank, but can be merely associated with the respective bank. In addition, one or more locking bits can be associated with one or more banks in the second set of banks of the mode control bits.

In some embodiments, the present invention may provide some customers with access to special internal device capabilities (e.g., cases in which the customer has paid the appropriate licensing fee or premium fee), but allow other customers to disable such capabilities or deny access to such capabilities. For example, if a customer desires a special algorithm or a special cryptographic configuration enabled within the device 100, the appropriate mode control bits can be programmed during the programming cycle to enable the desired configurations, features or functions of the device 100; or, if applicable, the appropriate mode control bits can be programmed outside the programming cycle to enable the desired configurations, features or functions of the device 100. If a customer wants to disable a feature or, perhaps, if the customer is not permitted to access such feature, the non-volatile memory 150 may be so programmed or the device 100 may resort to default values stored in the non-volatile memory 150. Alternatively, the device 100 may not use the non-volatile memory 150 at all during set up or operation.

The programming cycle or out-of-programming-cycle programming can be initiated, for example, locally at the manufacturing site or at a point of service or can be initiated remotely at a central processing center that can send the appropriate programming data via cables or wirelessly, ultimately reaching the chip interface 140. Such programming data and the transmission thereof may benefit from the appropriate security measures (e.g., encryption schemes) and unique identification (e.g., a unique identifier of the device 100 or the chip 110).

FIG. 2 shows a table illustrating an example of the memory allocation within the non-volatile memory 150 according to the present invention. The first two columns of the table provide field descriptions and respective bit allocations. The next four columns of the table provide memory bit attributes. Program Cycle Protection indicates whether the memory bits can only be written during a programming cycle and whether the memory bits are locked-out or protected from programming at the completion of the programming cycle. Cyclic Redundancy Check (CRC) Protection indicates whether the memory bits are protected by CRC and whether the memory bits are included in a CRC calculation. For example, CRC32 is a 32-bit CRC calculated on fields starting with the Device ID and continuing through the Mode Control 0 bank of mode control bits. Visible indicates whether the memory bit is readable, for example, by the processor 120, the device 100 or outside of the device 100. Hardware Dedicated indicates whether the bit states are used as part of internal hardware logic or are used only as programmable information bits.

The fields within the non-volatile memory can be generally described as memory data bits, mode control bits and memory management bits. The memory data bits may include, for example, the Device ID, Key 1 and Key 2. Device ID is 64-bits that are visible (i.e., that can be read out by the processor 120) and can provide a unique identifier for the device 100. Key 1 and Key 2 are each 64-bits, not visible outside the device 100 and are used inside the chip 110 as input to cryptographic functions (e.g., data encryption standard (DES) techniques). Additional information relating to cryptography, encryption and other matters can be found in U.S. patent application Ser. No. 09/900,224, filed Jul. 6, 2001, now issued U.S. Pat. No. 7,548,622, entitled "System and Method for the Concealment of Device Input Parameters," to Jeffrey D. Carr, and which is hereby incorporated herein by reference in its entirety.

The mode control bits may include, for example, Mode Control 0 and Mode Control 1. In this example, each bit in the mode control bits may represent a function or feature configuration for the device 100. However, a plurality of bits in the mode control bits may represent one or more function or feature configurations for the device 100. Mode control bits can also be used, for example, to control onboard logic in other sections of the device 100.

For example, the Encrypt_Engine mode control bit may have a default value which configures the device 100 for a particular level of encryption or security (e.g., selectable between no encryption, DES or 3DES). When the Encrypt_Engine mode control bit is programmed (e.g., from a binary 0 to a binary 1), the device 100 may be forced into the highest security mode (e.g., 3DES).

In another example, the Data_Output mode control bit may have a default value which enables a data output interface of the device 100. When the Data_Output mode control bit is programmed, the device 100 may disable the data output interface. Similarly, the Test_Port_Diag mode control bit may enable or disable access to test ports of the device 100 depending upon whether the Test_Port_Diag mode control bit stored the default or programmed value.

Lock_A and Lock_B bits may, for example, lockout programming of the respective seven reserved bits of Mode Control 1. The reserved bits may be provided for the selection of features or functions outside of the programming cycle. Accordingly, some of the mode control bits can be locked out after the programming cycle, while other mode control bits can be programmed (e.g., one-time programmed) and locked out by programming the appropriate lockout bit.

Other features and functions of the device 100 that may be configured via the mode control bits include, for example, display, sound or authentication configurations. The above-described features and functions of the device 100 are not intended to be an exhaustive list and may be dependent upon the choice of the device 100. Accordingly, one of ordinary skill in the art can determine additional features and functions of the device 100 (e.g., a set top box) that can be configured by the control mode bits without undue experimentation.

The memory management bits may include, for example, CRC32 and Programming Bits. The CRC32 is a 32-bit result from running the CRC32 algorithm over at least a portion of the non-volatile memory bits such as, for example, the bits which are part of Device ID, Key 1, Key 2 and Mode Control 0. Accordingly, data contents can be validated. The other memory management bits include the Programming Bits, which are, for example, two bits used to indicate the programming status of the device 100. The use of the first Programming Bit (FPB) and the second Programming Bit (SPB) add a hardware layer of protection and security for the programming cycle as will be discussed in greater detail below.

Figure 3:
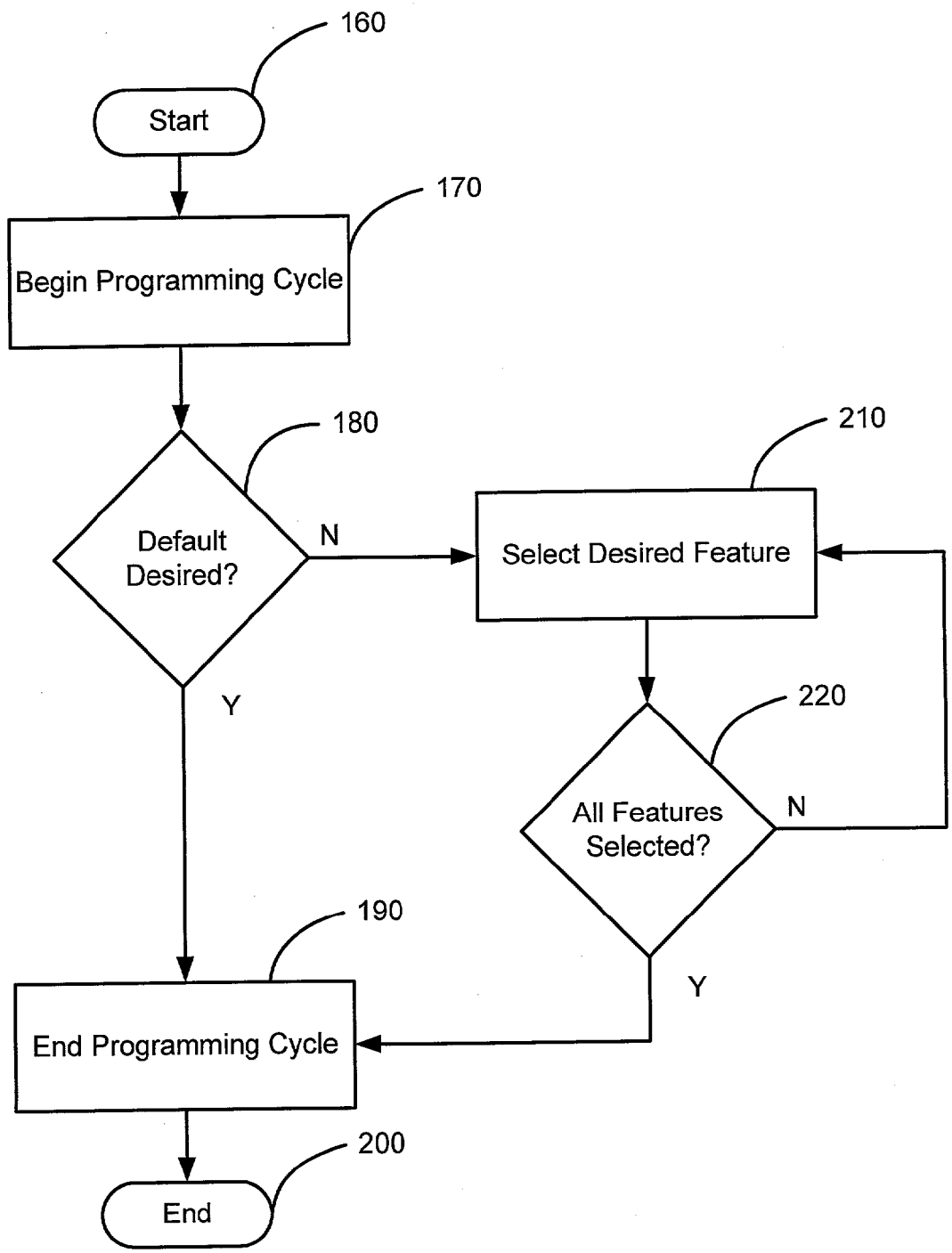
FIG. 3 is a flowchart illustrating an example of a method for programming a non-volatile memory according to the present invention.

FIG. 3 is a flowchart illustrating an example of a method for programming the non-volatile memory 150 according to the present invention. The process begins with steps 160 and 170 which include the start of the process and the beginning of the programming cycle, respectively. The beginning of the programming cycle may include the programming of the first of the Programming Bits, which when read by the processor 120, may enable or commence the programming cycle. In query 180, it is determined whether the default values are desired which are already stored in the portion of the non-volatile memory 150 that is affected by the programming cycle. An example of the portion of the non-volatile memory 150 that is affected by the programming cycle is indicated as benefiting from Program Cycle Protection as shown in FIG. 2. The default values may or may not be all binary zeroes. If the default values of the portion of the non-volatile memory 150 that is affected by the programming cycle are desired, then the process jumps to step 190. In step 190, the programming cycle ends. The ending of the programming cycle may include the programming of the second of the Programming Bits, which when read by the processor 120, may disable or terminate the programming cycle. With the programming of the second of the Programming Bits, the bits in the non-volatile memory 150 with Program Cycle Protection as set forth, for example, in FIG. 2 can not be further modified. The process ends in step 200.

In query 180, if it is determined that the default values of the portion of the non-volatile memory 150 that is affected by the programming cycle are not desired, then the process jumps to step 210. In step 210, the device 100 can be configured (i.e., upon successful completion of the programming cycle) for a particular feature or a particular function by programming the corresponding bit or bits in the non-volatile memory 150. For example, the Encrypt_Engine mode control bit can be programmed to force the device 100 into the highest level of encryption security. After selecting a desired feature, the process moves to query 220 in which it is determined whether all of the features desired have been selected. If not, then the selection of additional features of the device 100 continues back at step 210. If all of the desired features have been selected then the process jumps to steps 190 and 200 and the ending of the programming cycle and the ending of the process, respectively, as described above.

Figure 4:
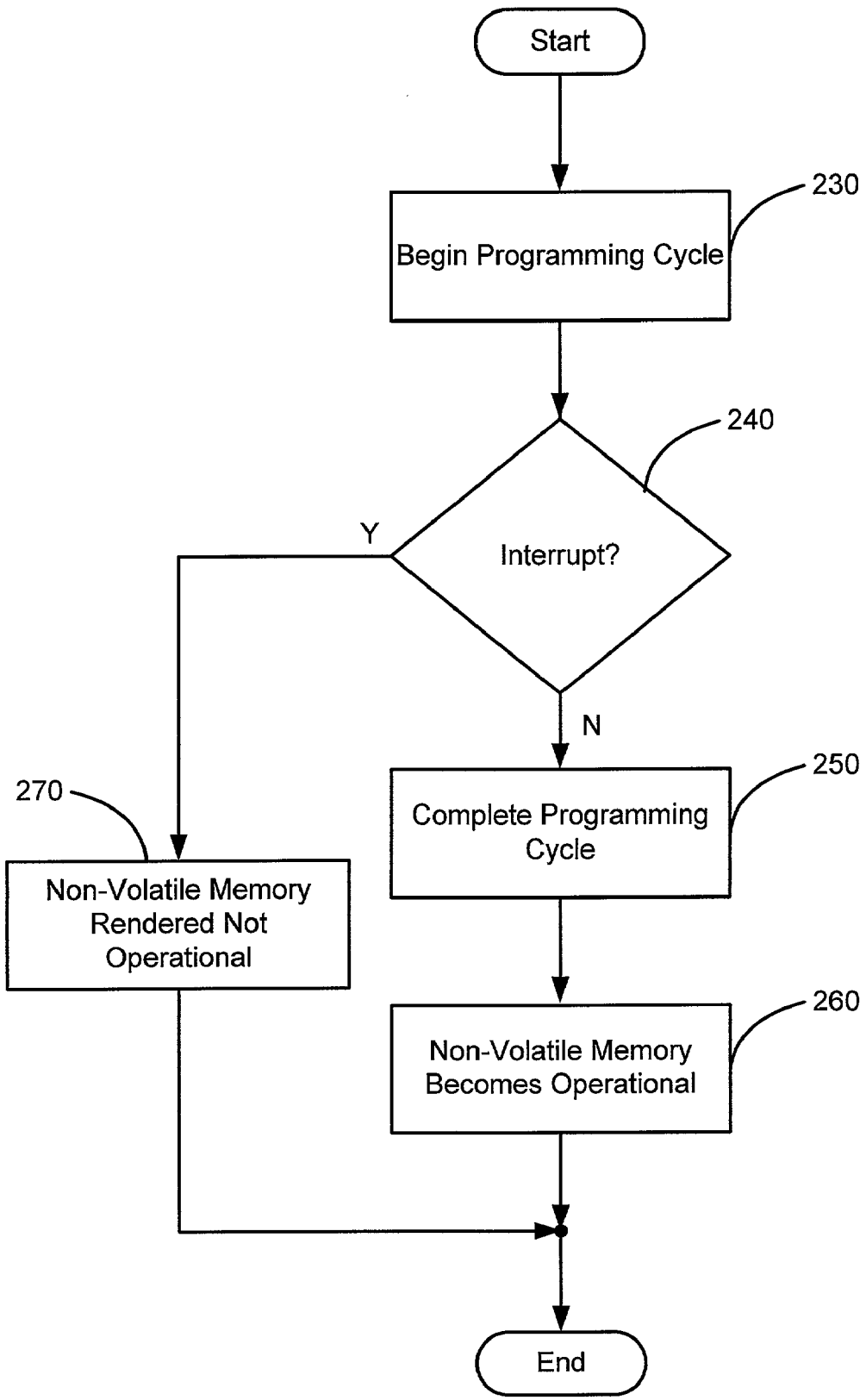
FIG. 4 is a flowchart illustrating an example of a method for programming the non-volatile memory according to the present invention.

FIG. 4 is a flowchart of an example of a method for programming the non-volatile memory 150 according to the present invention. In step 230, the programming cycle is commenced. The details of the programming cycle have already been described above with respect to, for example, FIG. 3. In query 240, it is determined whether or not an interruption has occurred during the programming cycle. If no interruption has occurred, then the process proceeds to step 250, the completion of the programming cycle. As described above, after a successful programming cycle, both the FPB and the SPB have programmed values (e.g., both will have binary ones stored in the respective bits, the "11" state). As a result of both the FPB and the SPB being successfully programmed, in step 260, the non-volatile memory 150 becomes operational and the device 100 can be configured according to the accessible values programmed in the non-volatile memory 150.

If an interruption does occur during the programming cycle, then the process proceeds to step 270 in which the non-volatile memory is rendered invalid or not operational. Since an interruption occurred, the Programming Bits are not both programmed and, as a result, the non-volatile memory 150 is not operational. Interruptions during the programming cycle may also be caused, for example, by reset conditions or loss of power. For example, if a loss of power occurs during the programming cycle, then the FBP is programmed and the SPB is not programmed (e.g., the "10" state), resulting in the read access to the non-volatile memory 150 being disabled. Under such a condition, the non-volatile memory 150 will not allow any further programming and will be rendered permanently invalid (i.e., cannot be accessed). In one example, an invalid non-volatile memory is permanently placed in reset mode causing the processor 210 to reset or reboot.

The case in which the FPB is not programmed and the SPB is programmed (e.g., the "01" state) is an illegal state and should not occur. If either the "10" state or the "01" state does occur as the device 100 comes up from reset or during normal operation, it may be assumed that the non-volatile memory 150 was not programmed correctly or that the non-volatile memory 150 was improperly tampered with. In either case, access to the non-volatile memory 150 is disabled. The mode controls may also be enabled to their most secure state (e.g., programmed to binary ones).

As discussed above, the non-volatile memory 150 can also have a second set of banks of memory control bits that are not programmable during the programming cycle. Thus, for example, as illustrated in FIG. 2, the first seven bits of the Mode Control 1 bits may be programmable (e.g., one-time programmable) outside of the programming cycle and, once programmed, may be locked in value by the programming of a lock bit such as Lock_A, for example. A similar relationship may be found between the next seven bits of the Mode Control 1 bits and the Lock B bit.

Figure 5:
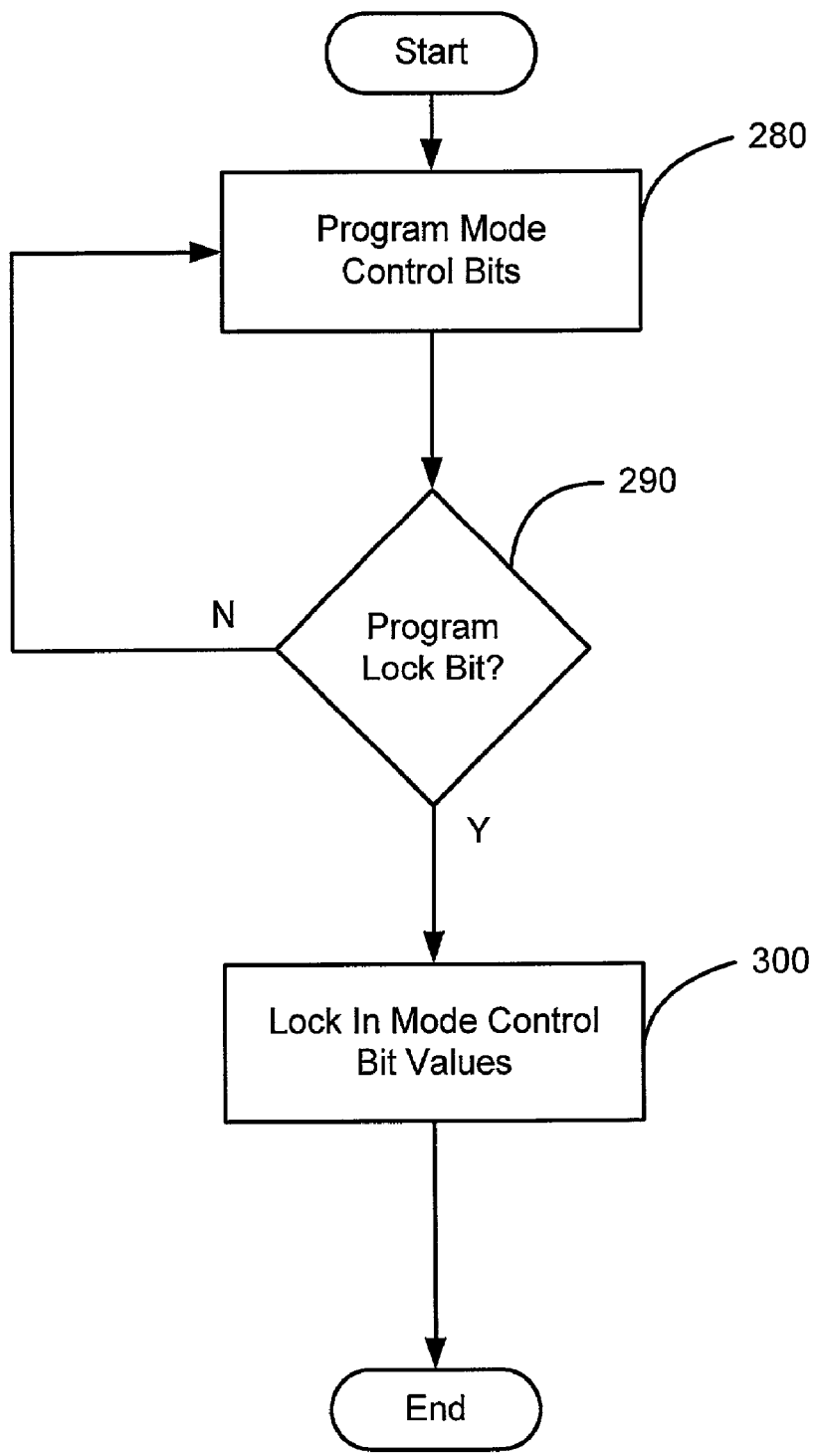
FIG. 5 is a flowchart of an example of a method for programming the non-volatile memory according to the present invention.

FIG. 5 is a flowchart of an example of a method for programming the non-volatile memory 150 according to the present invention. Some mode control bits (e.g., Mode Control 1 bits) are not programmed during the programming cycle as set forth in FIG. 3. Thus, after a successful programming cycle in which the some of the mode control bits are programmed and locked in their states, a second set of banks of mode control bits can still be programmed (step 280). In query 290, it is determined whether or not the locking bit associated with a respective bank of the second set has been programmed. If the locking bit has not yet been programmed, then the respective bank can still be programmed and the process jumps back to step 280. In one example, if the respective bank is one-time programmable and all of the bits in the respective bank have been programmed, then the \*process ends. Since the bits are only one-time programmable, the bits cannot be further programmed. In query 290, if it is determined that the locking bit has been programmed, then the respective bank has its bit values locked in (step 300). Thus, the respective bank cannot be further modified or programmed.

In another embodiment, the present invention may provide a secure method and system for accessing functions of the device 100 by a trusted user. In some embodiments, at least two mode control bits are used for each feature or function of the device 100. For example, the data output of the device 100 may be configured according to the two mode control bits corresponding to Data_Output. Accordingly, the Data_Output mode bits can have four states: 00, 01, 10, 11. In one example, the 00 state corresponds to a disabled device output; the 01 state corresponds to an enabled device output; the 10 state corresponds to a disabled device output; and the 11 state corresponds to an enabled device output after user authentication. Thus, a feature or function of the device 100 can be enabled after the user provides the proper authentication if the feature or function of the device 100 is in, for example, the 11 state. The Data_Output mode bits may be in the 11 state due to, for example, programming in the programming cycle, programming outside the programming cycle, default settings or other programming of the Data_Output mode bits.

Figure 6:
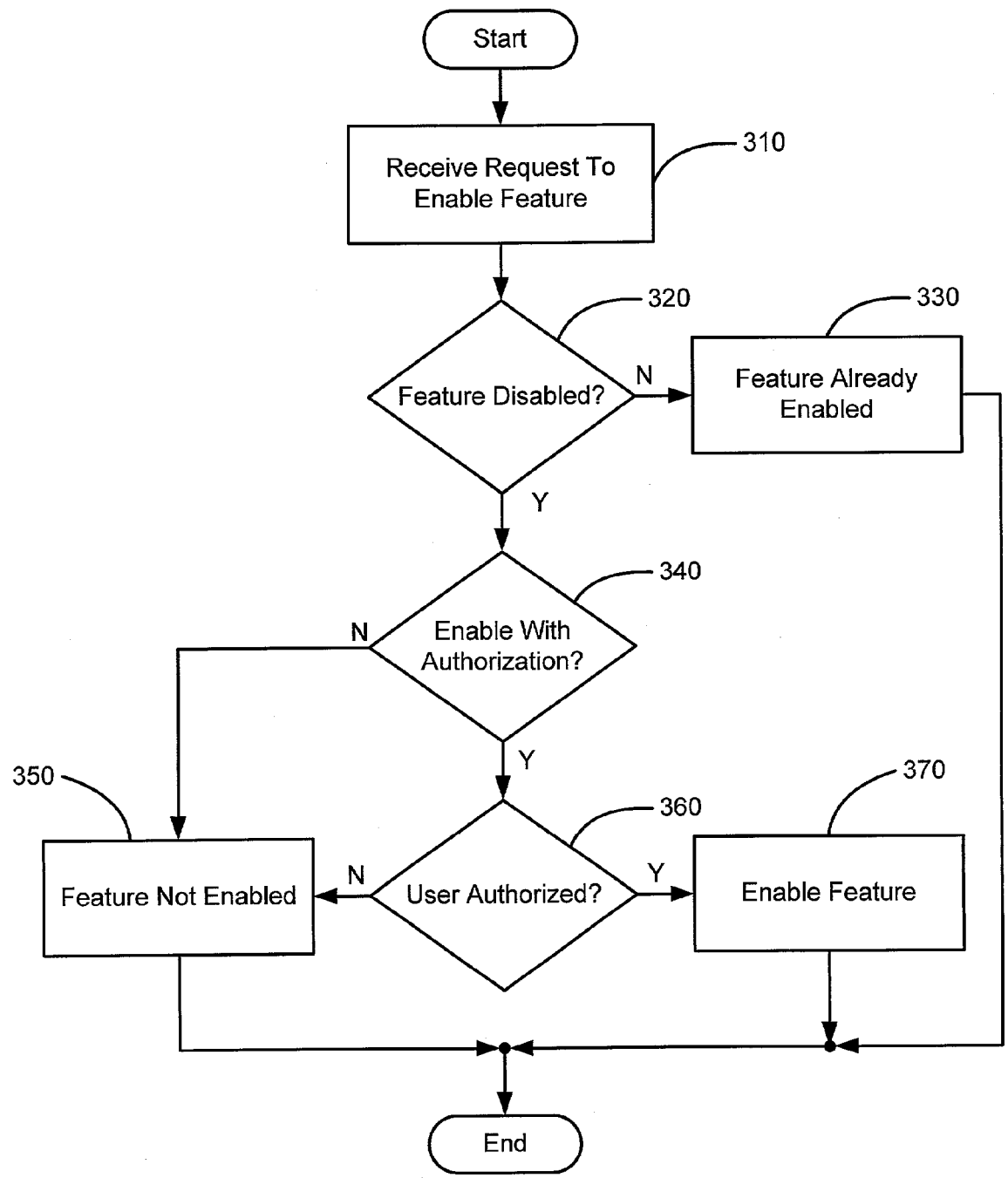
FIG. 6 is a flowchart of an example of a method for securely accessing functions of the device according to the present invention.

FIG. 6 is a flowchart of an example of a method for securely accessing functions of the device 100 by, for example, a trusted user according to the present invention. In step 310, the device 100 receives a request to enable a feature of the device 100. The request may be facilitated by a user via a user interface (e.g., keypad, keyboard, mouse, etc.) of the device 100, for example. In query 320, it is determined whether the requested feature is disabled. In one example, whether or not the requested feature is disabled can be determined from reading the mode control bits associated with the requested feature. If the requested feature is not disabled (e.g., feature mode control bits in 01 state), then the process proceeds to step 330 in which the device 100 notes that the feature is already enabled 330. This information may be displayed, for example, to the user, before ending the process. If the requested feature is disabled, then the process proceeds to query 340. In query 340, it is determined whether the requested feature can be enabled with authorization. If the requested feature cannot be enabled with authorization (e.g., feature mode control bits in 00 or 10 state), then, in step 350, the device 100 notes that the feature cannot be enabled. This information may be displayed, for example, to the user, before ending the process. If the requested feature can be enabled with authorization (e.g., feature mode control bits in 11 state), then, in query 360, it is determined whether the user is authorized. If the user is not authorized, then the process proceeds to step 350 before ending the process as described above. If the user is authorized, then the feature is enabled in step 370. This information may be displayed, for example, to the user, before ending the process. The user may be a person or a machine (e.g., a computer).

A secure authorization scheme may be employed in determining whether a user is authorized (query 360). In some embodiments, the present invention contemplates a challenge/response mechanism, password authentication or other authorization schemes including, for example, conventional authorization schemes known to those of ordinary skill in the art.

In an example of a challenge/response mechanism, the user initiates a device authentication process. The device 100 generates a Nonce(n) challenge value. The Nonce(n) is written to the output of the device 100 and is stored in an internal Nonce register. The user reads the Nonce(n), 3DES encrypts n to Key2 (i.e., $\{E(n)_{Key2}\}$) and returns $\{E(n)_{Key2}\}$ to the device 100. The device 100 checks if the internal Nonce register is not equal to zero. If the internal Nonce register is equal to zero, then the process is ended. If the internal Nonce register is not equal to zero, then the process proceeds. The device 3DES encrypts the Nonce that was stored in the internal Nonce register to Key2. This value is compared with the value input by the user. If the values are equal, then the user is authorized, the Nonce stored in the internal Nonce register is overwritten with zeroes (i.e., it is deleted) and the process proceeds to step 370 as described above. If the values are not equal, then the user is not authorized, the Nonce stored in the internal Nonce register is overwritten with zeroes (i.e., it is deleted) and the process proceeds to step 350 as described above.

A random Nonce may be generated in a number of ways including conventional processes known to one of ordinary skill in the art. In one example, the present invention exclusive ORs (i.e., XORs) a 64-bit pseudorandom number and the 64-bit Device ID that is stored in the non-volatile memory 150. Pseudorandom numbers can be generated, for example, in an alternating step generator configuration.

Figure 7:
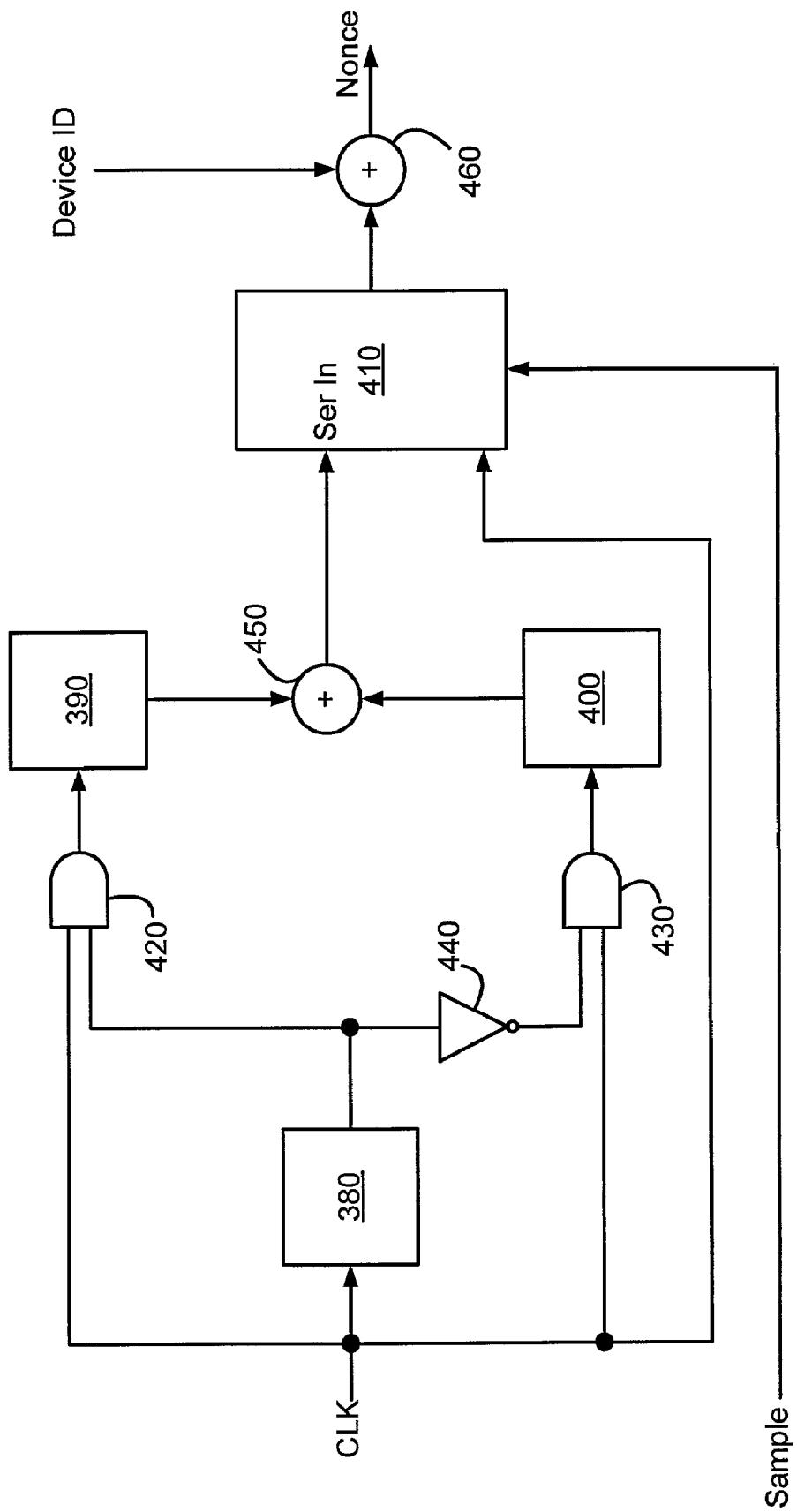
FIG. 7 is a representation of an example of a Nonce generator using an alternating step generator configuration according to the present invention.

FIG. 7 is a representation of an example of a Nonce generator using an alternating step generator configuration according to the present invention. The alternating step generator configuration that generates pseudorandom numbers may include, for example, three linear feedback shift registers (LFSR) 380, 390, 400, two AND gates 420, 430, an inverter 440, an XOR gate 450, a 64-bit register 410, a clock signal and a sample signal. The components and signals are coupled as illustrated in FIG. 7. The output of the alternating step generator configuration (i.e., the output of the register 410) is XORed, via an XOR gate 410, with the 64-bit Device ID to generate the Nonce.

The LFSRs 380, 390, 400 are each many-to-one external XOR feedback structures and have a maximal sequence length of $2^{L1}$, $2^{L2}$ and $2^{L3}-1$, respectively. Thus, the final output sequence may have a period of length $2^{L1}*(2^{L2}-1)*(2^{L3}-1)$.

In operation, when a challenge is received, the LFSRs 380, 390, 400 are initialized using an initial value or values. The LFSRs 380, 390, 400 are run and the sampling is disabled until at least 128 bits have been produced. The alternating step generator configuration continuously free runs and serially loads the register 410. The parallel output value of the register 410 is sampled after the register 410 has been allowed to fill and when a Nonce value is needed. When sampled in response to a challenge request, the 64-bit sample output block is XORed with the 64-bit Device ID at the XOR gate 460 to produce the challenge.

Another example of a secure authorization scheme includes a password authentication. The user provides the device 100 with a password. The device 100 processes the password. If the result of processing the password is known or recognized by the device 100, then user is an authorized user.

If the result of processing the password is not known or is not recognized by the device 100, the user is not an authorized user.

In an embodiment according to the present invention, the user can supply the device 100 with a password. The password may be, for example, the unique device identification encrypted to a shared key (i.e., {E(Device ID)$_{Key2}$}). The device 100 can then decrypt the encrypted Device ID and compare with Device ID, which may be stored in the non-volatile memory 150. If they match, then the password is authenticated and the user is authorized. If they do not match, then the password is not authenticated and the user is not authorized.

Thus, it is seen that systems and methods for securely controlling access to device functions are provided. One skilled in the art will appreciate that the present invention can be practiced by other than the preferred embodiments which are presented in this description for purposes of illustration and not of limitation, and that the present invention is limited only by the claims that follow. It is noted that equivalents for the particular embodiments discussed in this description may practice the present invention as well.

What is claimed is:

1. A method for securely controlling access to a feature of a device, comprising the steps of:
   (a) receiving a request to enable the feature of the device;
   (b) determining whether the feature is disabled;
   (c) determining whether the feature can be enabled with authorization;
   (d) determining whether a requestor is authorized to enable the feature of the device;
   (e) if the feature is disabled, if the feature can be enabled with authorization and if the requestor is authorized to enable the feature of the device, then enabling the feature of the device by modifying bit values stored in a bank of control bits, the bank of control bits comprising a one-time programmable bit; and
   (f) locking the modified bit values stored in the bank of control bits by setting the one-time programmable bit of the bank of control bits.

2. The method according to claim 1, wherein step (b) comprises reading a state of mode control bits corresponding to the feature of the device.

3. The method according to claim 2, wherein the step of reading comprises reading the state of the mode control bits on a non-volatile memory.

4. The method according to claim 1, wherein step (c) comprises reading a state of mode control bits corresponding to the feature of the device.

5. The method according to claim 4, wherein the step of reading comprises reading the state of the mode control bits on a non-volatile memory.

6. The method according to claim 1, wherein step (d) comprises:
   generating a challenge value by the device,
   storing the challenge value,
   sending the challenge value to the requestor,
   encrypting the challenge value by the requestor,
   sending the encrypted challenge value back to the device,
   decrypting the encrypted challenge value by the device, and
   comparing the stored challenge value with the decrypted challenge value.

7. The method according to claim 6, further including the step of, if the stored challenge value and the decrypted challenge value are equal, then the requestor is authorized.

8. The method according to claim 6, wherein the step of generating the challenge value by the device comprises generating the challenge value as a function of a pseudorandom number.

9. The method according to claim 6, wherein the step of generating the challenge value by the device comprises generating the challenge value as a function of a device identification stored in a non-volatile memory of the device.

10. The method according to claim 6, wherein the challenge value is a Nonce challenge value.

11. The method according to claim 6, wherein the step of encrypting the challenge value by the requestor comprises encrypting the challenge value using at least one of a data encryption standard (DES) encryption or a 3-DES encryption.

12. The method according to claim 1, wherein step (d) comprises:
   supplying a password to the device,
   processing the password by the device,
   comparing the processed password with acceptable values, and
   if the processed password is one of the acceptable values, then authenticating the password and authorizing the requestor.

13. The method according to claim 12, wherein the step of supplying comprises encrypting a unique device identification with a shared key.

14. The method according to claim 13,
   wherein the step of processing the password comprises decrypting the encrypted unique device identification, and
   wherein the step of comparing comprises comparing the decrypted identification with the unique device identification stored in a non-volatile memory in the device.

15. The method according to claim 12, wherein the step of processing comprises decrypting the supplied password.

16. The method according to claim 13, wherein the step of encrypting comprises encrypting a data encryption standard (DES) encryption or a 3-DES encryption.

17. A system for securely controlling access to features of a device, comprising:
   a non-volatile memory including a bank of mode control bits that correspond to the features of the device, the bank of the mode control bits indicating whether a particular feature of the device is one of disabled, enabled and capable of being enabled with user authorization; and
   a processor coupled to the non-volatile memory, the processor being configured to perform at least the following:
      receiving a request to enable the particular feature of the device,
      determining whether the particular feature is disabled,
      determining whether the particular feature can be enabled with the user authorization,
      determining whether a user is authorized to enable the particular feature of the device, and
      if the particular feature is disabled, if the particular feature can be enabled with the user authorization and if the user is authorized to enable the particular feature of the device, then enabling the particular feature of the device by modifying bit values stored in the bank of mode control bits, the bank of mode control bits comprising a one-time programmable bit,
   wherein the modified bit values stored in the bank of mode control bits are locked by setting the one-time programmable bit of the bank of mode control bits.

18. A system for securely controlling access to a feature of a device, comprising:
 a chip interface that receives a request to enable the feature of the device;
 one or more circuits that are operatively coupled to the chip interface, wherein the one or more circuits determine whether the feature is disabled, wherein the one or more circuits determine whether the feature can be enabled with authorization, wherein the one or more circuits determine whether a requestor is authorized to enable the feature of the device, and wherein the one or more circuits enable the feature of the device if the feature is disabled, if the feature can be enabled with authorization and if the requestor is authorized to enable the feature of the device by modifying bit values stored in a bank of control bits, the bank of control bits comprising a one-time programmable bit; and
 a locking mechanism that locks the modified bit values stored in the bank of control bits by setting the one-time programmable bit of the bank of control bits.

19. The system according to claim 18, wherein the one or more circuits comprise a processor.

20. The system according to claim 18, wherein the one or more circuits are part of a chip, wherein the chip interface is an interface of the chip, and wherein the bank of control bits are part of the chip.

21. The system according to claim 20, wherein the chip is part of a set top box.

* * * * *